(12) United States Patent
Jeon (10) Patent No.: US 6,682,956 B2
(45) Date of Patent: Jan. 27, 2004

(54) METHOD OF FABRICATING PACKAGE HAVING METAL RUNNER

(75) Inventor: In Su Jeon, Kyoungki-do (KR)

(73) Assignee: Hynix Semiconductor Inc., Ich'on (KR)

( * ) Notice: Subject to any disclaimer, the term of this patent is extended or adjusted under 35 U.S.C. 154(b) by 42 days.

(21) Appl. No.: 10/017,320

(22) Filed: Dec. 18, 2001

(65) Prior Publication Data

US 2003/0045023 A1 Mar. 6, 2003

(30) Foreign Application Priority Data

Aug. 30, 2001 (KR) .......................... 2001-52869

(51) Int. Cl.7 .................... H01L 21/44; H01L 21/48; H01L 21/50
(52) U.S. Cl. .................... 438/123; 438/611; 438/613
(58) Field of Search .................... 438/123, 611, 438/612, 613

(56) References Cited

U.S. PATENT DOCUMENTS 6,236,112 B1   5/2001   Horiuchi et al.
6,455,408 B1 * 9/2002   Hwang et al. .............. 438/613

* cited by examiner

Primary Examiner—Caridad Everhart
Assistant Examiner—Chuong A Luu
(74) Attorney, Agent, or Firm—Jacobson Holman PLLC

(57) ABSTRACT

A method for fabricating a chip size package having a metal runner capable of preventing split generation due to stress in a solder mask made of a polymer such as BCB. The disclosed method includes steps of forming a stress buffer layer on a semiconductor chip having a plurality of bonding pads to expose a bonding pad; applying negative type photoresist on the stress buffer layer; forming a photoresist pattern having a convex cross section and defining a metal runner formative region by exposing and developing the photoresist; forming a predetermined metal layer having a height similar to that of the photoresist pattern on the metal runner formative region; removing the photoresist pattern to form a metal runner being in contact with the bonding pads of the semiconductor chip and having a concave cross section; forming a solder mask to expose a ball land of the metal runner on the stress buffer layer including the metal runner; and adhering a solder ball on the exposed ball.

11 Claims, 10 Drawing Sheets

METHOD OF FABRICATING PACKAGE HAVING METAL RUNNER

BACKGROUND OF THE INVENTION

1. Field of the Invention

The present invention relates to a method of fabricating a package having metal runner and, more particularly, to a metal runner fabrication method to prevent splits of a solder mask due to differences of thermal strain between the metal runner and the solder mask.

2. Description of the Related Art

A chip size package, in which more than 80% of the whole package size is occupied by a semiconductor chip, has been developed in various fields since it has advantages of small size and light weight. In the chip size package, a greater number of packages than in a conventional semiconductor package are packaged on the same printed circuit boards. Therefore, chip size packages are applied to high performance electric and electronic products.

Generally, a pad rearrangement process is required to fabricate the chip size package. The pad arrangement is a process whereby a bonding pad of semiconductor chip is rearranged in a predetermined position. In a conventional method, a metal runner is formed for the pad rearrangement. The metal runner is generally made of copper or aluminum.

The pad rearrangement process is performed in fabrications of chip size packages, ball grid array packages and wafer level packages.

Figure 1:
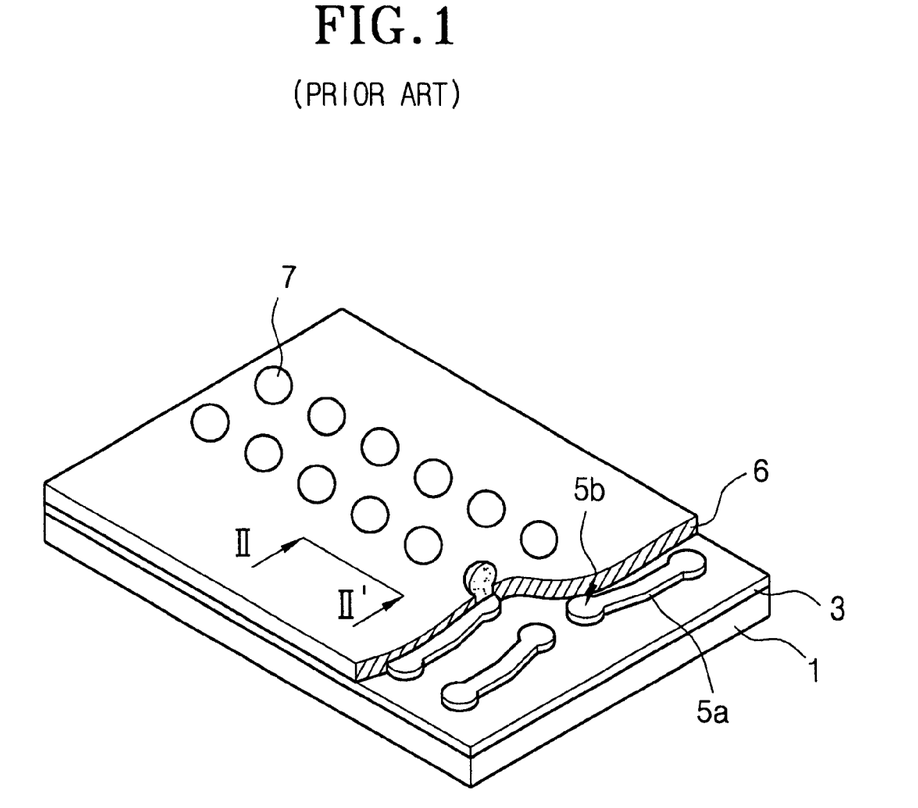
FIG. 1 shows a conventional chip size package having a metal runner.

FIG. 1 is a drawing showing a conventional chip size package having a metal runner. As shown in FIG. 1, a stress buffer layer 3 is formed on a semiconductor chip to expose the bonding pads (not shown) and a metal runner 5a is formed on the stress buffer layer 3. The metal runner 5a is made of copper and connected to each bonding pad (not shown). On the stress buffer layer 3 and the metal runner 5a, a solder mask 6, made of a polymer such as Benzo Cyclo Butyne (BCB), is formed to expose a ball land 5b of the metal runner 5a. On the exposed ball land 5b, a solder ball 7 is formed.

FIGS. 2A to 2E are cross-sectional views taken along line II–II' of FIG. 1 to show a method of forming the above-mentioned conventional package.

Figure 2A:
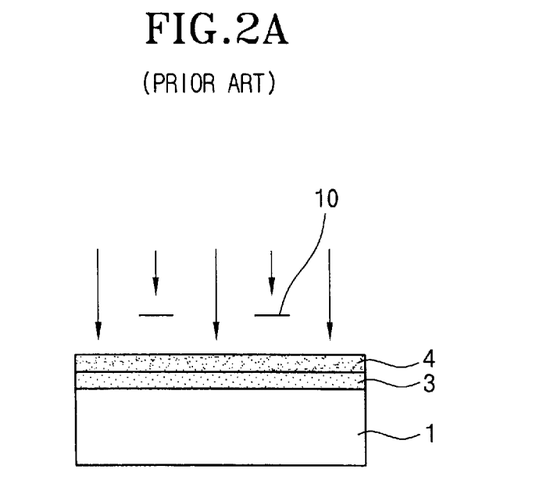
FIGS. 2A to 2E are cross-sectional views taken along line II–II' of FIG. 1 illustrating a fabrication method for the conventional chip size package of FIG. 1.
Figure 2B:
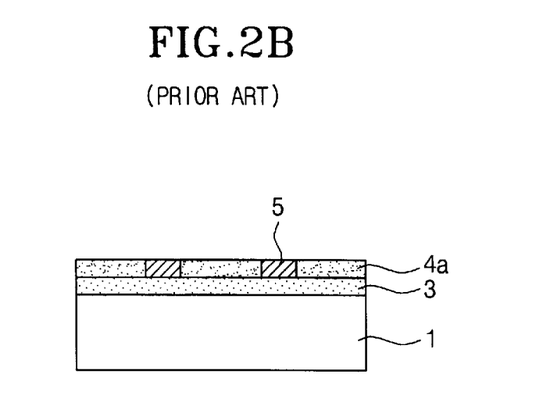

Referring to FIG. 2A, a stress buffer layer 3 is formed on a semiconductor chip 1 to expose the bonding pads (not shown). Negative type photoresist 4 is applied on the stress buffer layer 3 and then, the photoresist 4 is exposed by using an exposure mask 10. Subsequently, as shown in FIG. 2B, a photoresist pattern 4a is formed which has a rectangular cross section and defines a metal runner formative region.

Figure 2C:
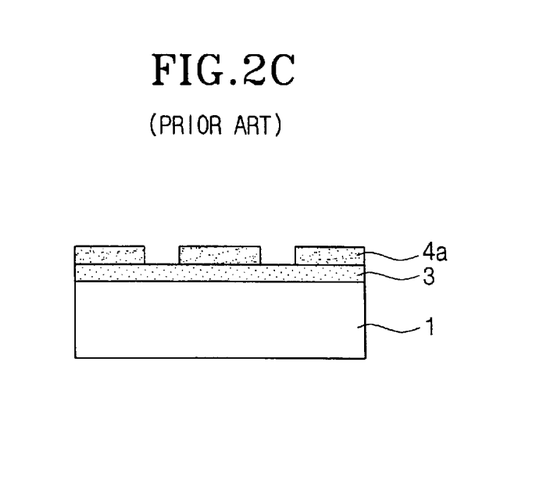
Figure 2D:
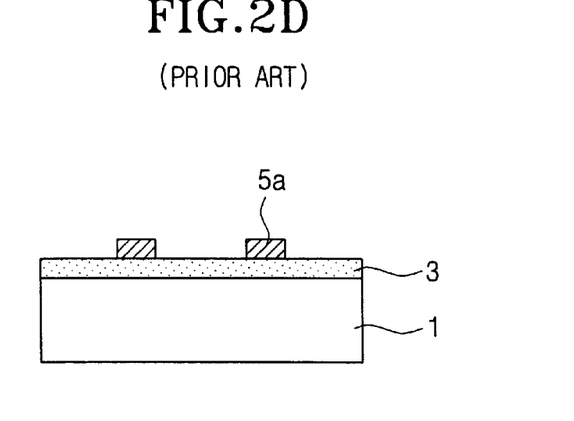

Referring to FIG. 2C, a copper layer 5 is formed to have a height similar to the photoresist pattern 4a by using a plating process on the metal runner formative region defined by the photoresist pattern 4a. Then, as shown in FIG. 2D, the photoresist pattern 4a is removed, thereby forming metal runners 5a having a rectangular cross section and being in contact with each bonding pad of the semiconductor chip 1 on the stress buffer layer 3.

Figure 2E:
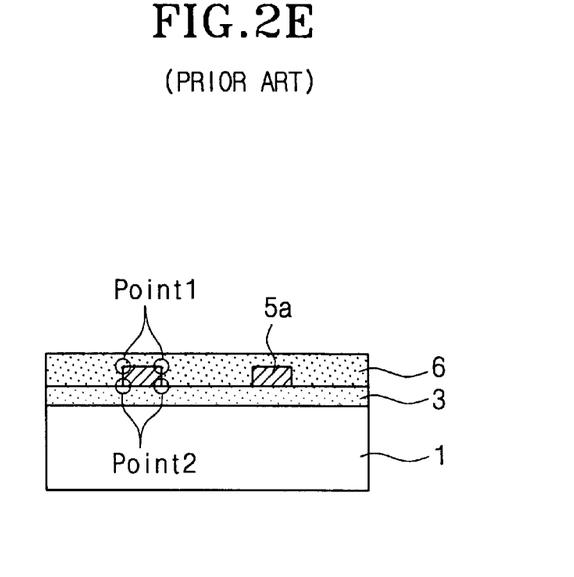

Referring to FIG. 2E, a solder mask 6, made of a polymer such as BCB, is formed to expose a ball land (not shown) of the metal runner 5a on the stress buffer layer 3 and the metal runner 5a. Thereafter, although it is not shown in the drawings, a solder ball is adhered on the exposed ball land of the metal runner 5a, thereby completing the chip size package.

However, according to the conventional chip size package having a metal runner, when thermal load is applied from the outside into the package during temperature cycle test, thermal strain differences are generated between the metal runner and the solder mask comprising polymer such as BCB, whereby stresses are concentrated on each corner of the metal runner, marked as stress concentration points 1 and 2. As a result, splits are generated on the solder mask.

When the solder mask has a thickness much thicker than that of the metal runner, the splits of solder mask are not generated by the stress concentration. However, it is still impossible to prevent generation of splits in solder mask since the solder mask is formed by a spin coating process and it is difficult to coat thickly. Even when a thick solder mask is formed, folds are generated and it is difficult to perform a patterning process after exposure. Therefore, according to the conventional method, the solder mask and the metal runner have a thickness of approximately 10 to 15 μm and 10 μm, respectively.

SUMMARY OF THE INVENTION

Therefore, the present invention has been made to solve the above problems and an object of the present invention is to provide a method of fabricating a package having metal runner while preventing generation of splits in the solder mask due to stress concentration.

In order to accomplish the above object, the present invention comprises steps of: forming a stress buffer layer on a semiconductor chip having a plurality of bonding pads to expose the bond pad; applying negative type photoresist on the stress buffer layer; exposing and developing the photoresist to form a photoresist pattern having a convex cross section and defining a metal runner formative region; forming a metal layer having a height approximately equal to that of the photoresist pattern on the metal runner formative region; removing the photoresist pattern to form metal runner being in contact with the bonding pad of the semiconductor chip and having a concave cross section; forming a solder mask exposing a ball land of the metal runner on the stress buffer layer including the metal runners; and adhering a solder ball on the exposed ball land.

The present invention also comprises steps of forming a stress buffer layer on a semiconductor chip having a plurality of bonding pads to expose the bonding pad; applying a first photoresist of negative type on the stress buffer layer; forming a first photoresist pattern having an inverse trapezoidal cross section by exposing and developing the first photoresist; forming a first metal layer in spaces formed by the first photoresist pattern; applying a second photoresist on the first photoresist pattern and on the first metal layer; forming a second photoresist pattern exposing the first metal layer and having a trapezoidal cross section by exposing and developing the second photoresist; forming a second metal layer on the exposed first metal layer; removing the second and the first photoresist pattern to form a metal runner being in contact with the bonding pad of the semiconductor chip and having a concave cross section; forming a solder mask on the stress buffer layer including the metal runners to expose a ball land of the metal runner; and adhering a solder ball on the exposed ball land.

Moreover, the present invention may also comprise steps of forming a stress buffer layer on a semiconductor chip having a plurality of bonding pads to expose the bonding pad; stacking negative type photoresist tapes having different etching speeds, wherein etching speeds of upper and lower tapes are higher than that of a center tape, on the stress buffer layer; forming a photoresist pattern having a convex cross section and defining a metal runner formative region by exposing and developing the photoresist tapes; forming a metal layer on the metal runner formative region; removing the photoresist pattern to form metal runners being in contact with each bonding pad of the semiconductor chip and having a concave cross section; forming a solder mask on the stress buffer layer including the metal runners to expose a ball land of the metal runner; and adhering a solder ball on the exposed ball land.

The above objects, and other features and advantages of the present invention will become more apparent after reading the following detailed description when taken in conjunction with the drawings.

DETAILED DESCRIPTION OF THE INVENTION

FIGS. 3A to 3E are cross sectional views illustrating a method for fabricating a chip size package having a metal runner according to a first embodiment of the present invention.

Figure 3A:
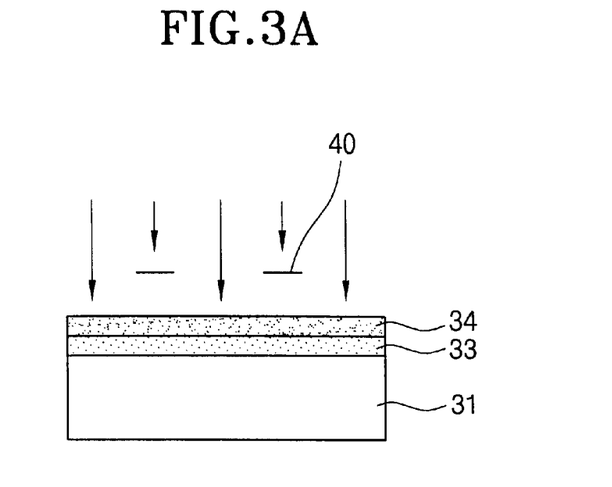
FIGS. 3A to 3E are cross sectional views showing a method of fabricating a chip size package having a metal runner according to an embodiment of the present invention.

Referring to FIG. 3A, a stress buffer layer 33 is formed on a semiconductor chip 31 to expose the bonding pad (not shown). A negative type photoresist 34 is applied on the stress buffer layer and then the photoresist 34 is exposed using an exposure mask 40.

Figure 3B:
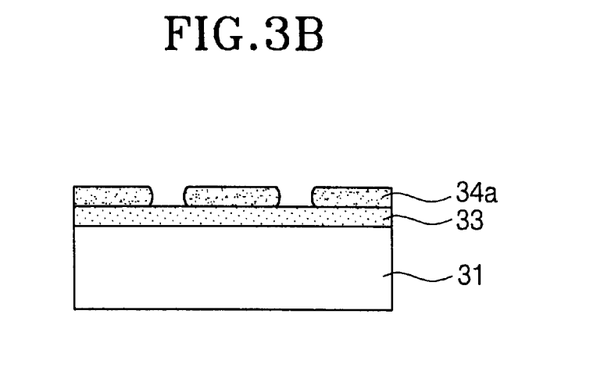

Referring to FIG. 3B, the exposed photoresist is developed to form a photoresist pattern 34a defining a metal runner formative region and having a convex cross section. The convex cross section of the photoresist pattern is obtained by controlling temperature and time of preliminary bake, exposure sensitivity, content of solvent and developing time.

Figure 3C:
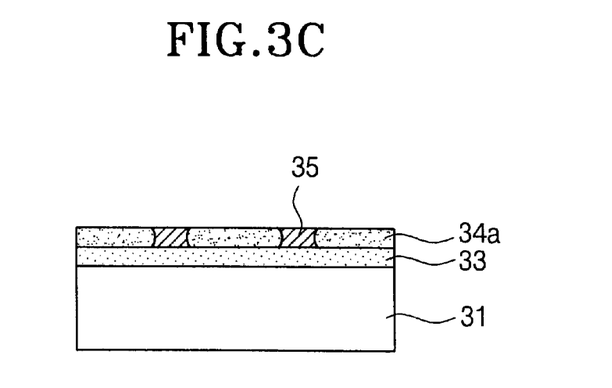

Referring to FIG. 3C, a copper layer 35 is formed to have a height similar to that of the photoresist pattern 34a by a plating process on the metal runner formative region defined by the photoresist pattern 34a.

Figure 3D:
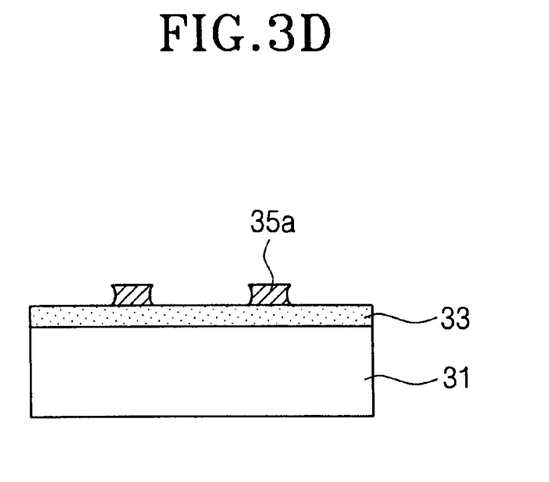

Referring to FIG. 3D, the photoresist pattern 34a is removed to form metal runners 35a being in contact with each bonding pad of the semiconductor chip 31 and having a concave cross section.

Figure 3E:
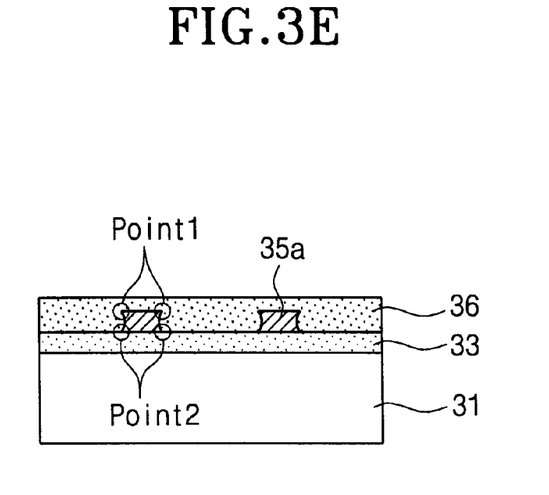

Referring to FIG. 3E, a solder mask 36, made of a polymer such as BCB, is formed to expose a ball land (not shown) of the metal runner 35a on the stress buffer layer 33 and on metal runners 35a. Thereafter, although it is not shown, a solder ball is adhered on a ball land of the exposed metal runner 35a, thereby completing a package having a metal runner according to the present invention.

As described above, the package of the present invention has a metal runner having a concave cross section and therefore, split generation due to stress concentration is lowered in the solder mask, as compared with a conventional package including a metal runner having a rectangular cross section. Because the metal runner has a concave cross section, stress concentrated on each corner is remarkably reduced.

Figure 4A:
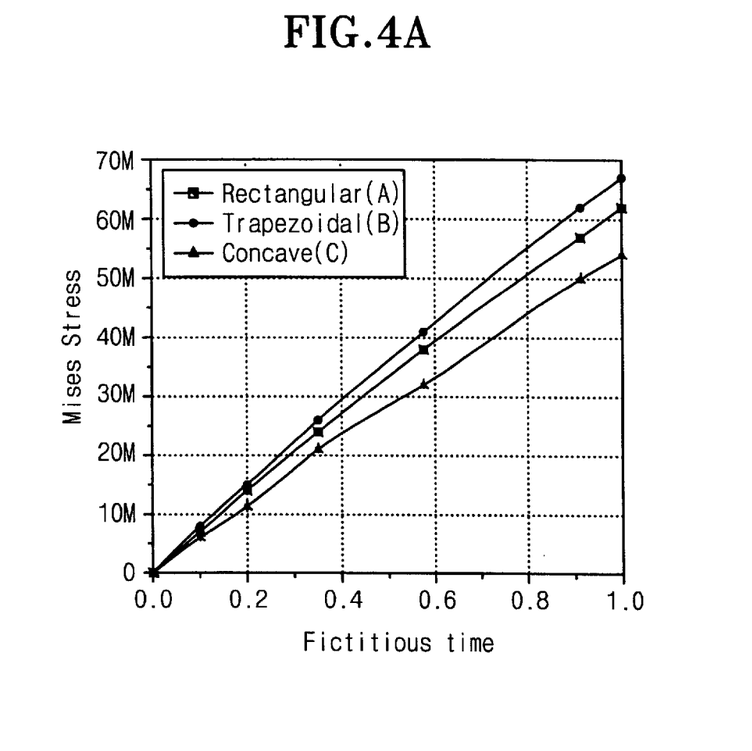
FIGS. 4A and 4B are graphs showing Mises Stress in the vicinities of point 1 and point 2 of metal runner versus cross sectional shapes of metal runner.
Figure 4B:
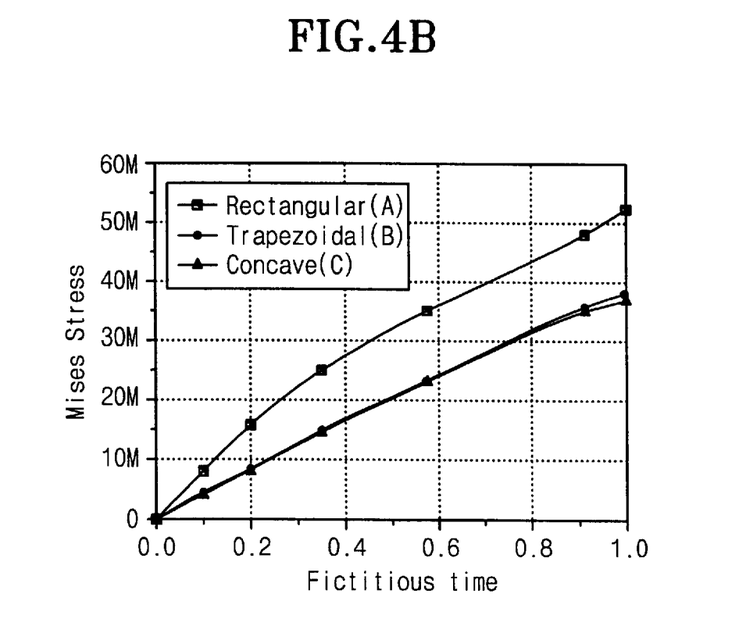

FIGS. 4A and 4B are graphs for showing Mises stress in the vicinity of stress concentration points 1 and 2 in metal runners having a rectangular cross section, a trapezoidal cross section and a concave cross section. Here, the stress concentration point 1 indicates an upper corner of each metal runner and the point 2 indicates a lower corner thereof, as shown in FIGS. 1E and 3E.

Referring to FIG. 4A, a metal runner C having a concave cross section has a Mises stress lower than that of metal runners A, B having a rectangular cross section and trapezoidal cross section, respectively, in the vicinity of point 1.

Referring to FIG. 4B, the metal runner C having a concave cross section has a Mises stress lower than that of the metal runner A having a rectangular cross section and similar to that of the metal runner B having a trapezoidal cross section in the vicinity of point 2.

As described above, the metal runner A, having a rectangular cross section, has a Mises stress higher than that of the metal runner C, having a concave cross section according to the present invention, in the vicinities of stress concentration points 1 and 2. As a result, the rectangular cross section is less desirable for preventing split generation in the solder mask.

The metal runner B, having a trapezoidal cross section, has a Mises stress higher than that of the metal runner A, having a rectangular cross section, in the vicinity of point 1 but the Mises stress of metal runner A is lower in the vicinity of point 2. As a result, the trapezoidal cross section is also less desirable for preventing split generation in the solder mask.

By contrast, the metal runner C, having a concave cross section accordingly to the present invention, has a Mises stress lower than that of metal runners A, B having a rectangular cross section and a trapezoidal cross section, respectively in the vicinities of both points 1 and 2. As a result, the concave cross section is most desirable for preventing split generation in the solder mask. Compared with the metal runner A, the metal runner C with its concave cross section has a stress reduction effect of 12.5% in the vicinity of point 1 and 27.2% in the vicinity of point 2.

Therefore, the chip size package having a concave cross section according to the present invention is capable of reducing stress concentrated on each corner of the metal runner when thermal load is applied from outside during thermal cycling test and therefore, split generation is reduced in the solder mask.

FIGS. 5A to 5E are cross sectional views showing a method of fabricating a package having a metal runner according to a second embodiment of the present invention.

According to this embodiment, a photo process is performed twice to form a photoresist pattern having a convex cross section to obtain a metal runner having a concave cross section.

Figure 5A:
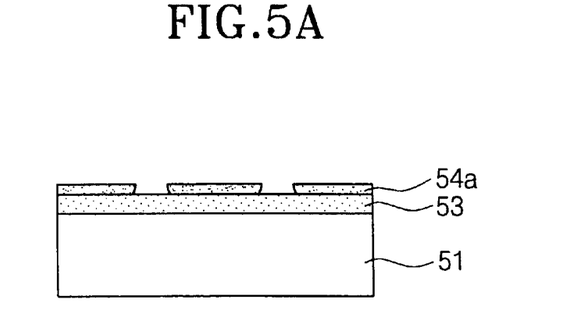
FIGS. 5A to 5E are cross sectional views showing a method for fabricating a chip size package having a metal runner according to a second embodiment of the present invention.

Referring to FIG. 5A, a stress buffer layer 53 is formed on a semiconductor chip 51 to expose the bonding pad (not shown). Subsequently, a first photoresist of negative type is applied on the stress buffer layer 53 and then, a first photoresist pattern 54a is formed to define a metal runner formative region and to have an inverse trapezoidal cross section by exposing and developing the first photoresist. The first photoresist has a thickness of about 50% that of the height of the metal runner.

Figure 5B:
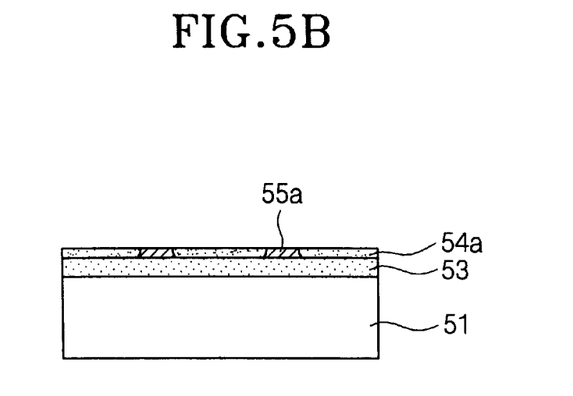

Referring to FIG. 5B, a first copper layer 55a is formed as a metal layer for metal runner to have a height similar to that of the first photoresist pattern 54a by using a plating process on the region defined by the first photoresist pattern 54a.

Figure 5C:
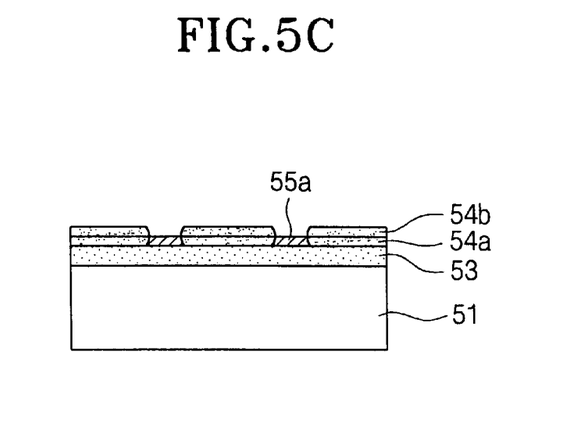

Referring to FIG. 5C, a second photoresist of negative type is applied on the first copper layer 55a and on the first photoresist pattern 54a and then, a second photoresist pattern 54b is formed to expose the first copper layer and to have a trapezoidal cross section by exposing and developing the second photoresist. Here, the combined thickness of the second photoresist and the first photoresist [put together] corresponds to that of the metal runner.

Figure 5D:
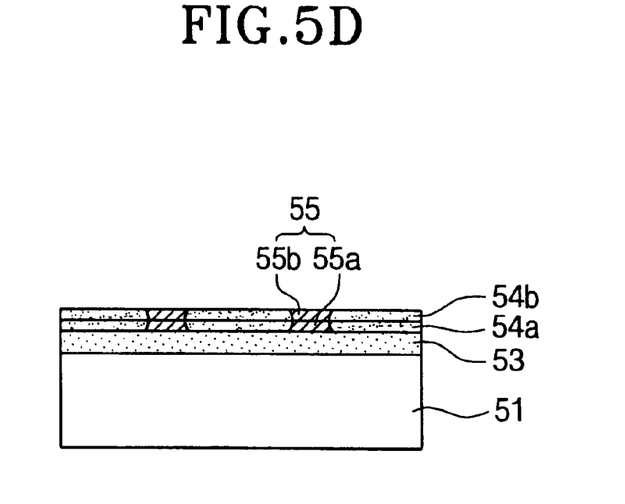

Referring to FIG. 5D, a second copper layer 55b is formed to have a height similar to that of the second photoresist pattern 54b on the exposed first copper layer 55a.

Figure 5E:
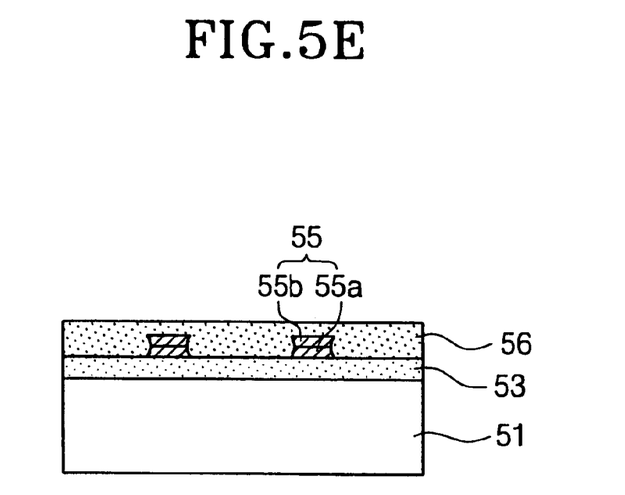

Referring to FIG. 5E, the second and the first photoresist patterns are removed to form a metal runner 55 and then a solder mask 56 comprising BCB is formed to expose a ball land (not shown) of the metal runner 55 on the metal runner 55 and on the stress buffer layer 53. Thereafter, although it is not shown, a solder ball is adhered on the exposed ball land, thereby completing a package.

According to this embodiment, stress concentration is reduced on each corner of the metal runner 55 since the metal runner 55 has a concave cross section. Therefore, split generation is reduced in the solder mask 56 made of BCB.

FIGS. 6A to 6E are cross sectional views showing a method for fabricating a package having a metal runner according to a third embodiment of the present invention.

According to this embodiment, photoresist tapes, having different etching speeds, are used to form a photoresist pattern having a convex cross section to obtain a metal runner having a concave cross section.

Figure 6A:
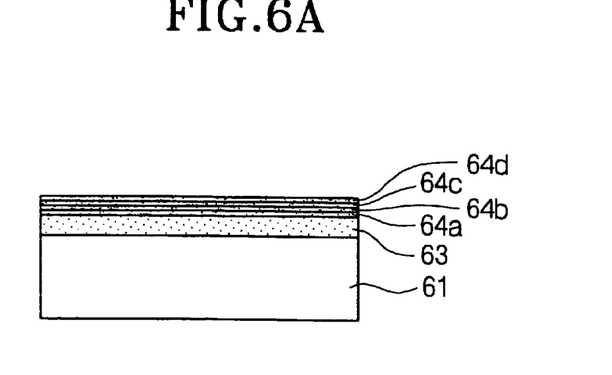
FIGS. 6A to 6E are cross sectional views showing a method for fabricating a metal runner according to a third embodiment of the present invention.

Referring to FIG. 6A, a stress buffer layer 63 is formed on a semiconductor chip 61 to expose the bonding pad (not shown). Then, a plurality of, for example, four negative type photoresist tapes 64a, 64b, 64c, 64d are stacked on the stress buffer layer 63. The photoresist tapes 64a, 64b, 64c, 64d have different etching speeds and the first and the fourth photoresist tapes 64a, 64d have etching speeds higher than that of the second and the third photoresist tapes 64b, 64c.

Figure 6B:
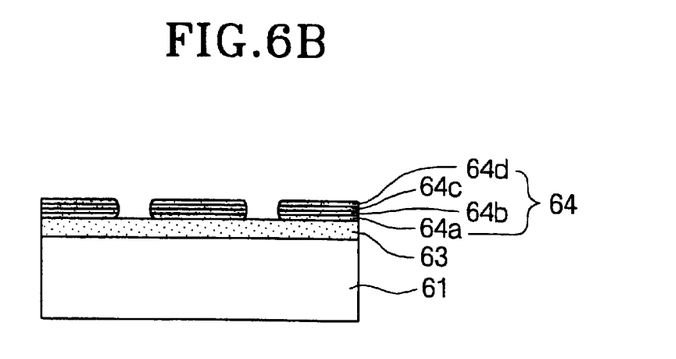

Referring to FIG. 6B, the stacked photoresist tapes 64a, 64b, 64c, 64d are exposed and developed to form a photoresist pattern 64 defining a metal runner formative region and having a convex cross section.

Figure 6C:
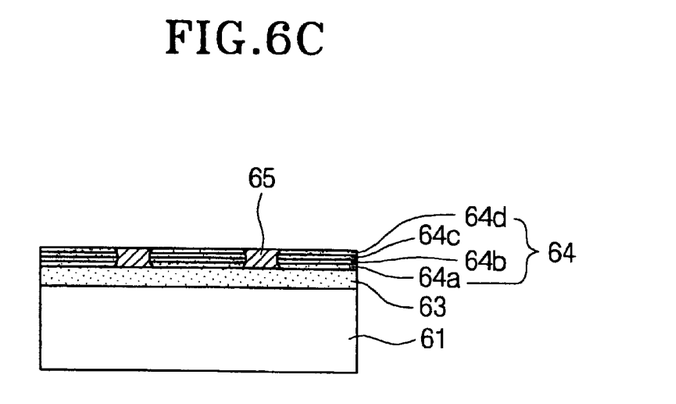

Referring to FIG. 6C, a predetermined metal layer, for example, a copper layer 65 is formed to have a height similar to that of the photoresist pattern 64 on the metal runner formative region defined by the photoresist pattern 64.

Figure 6D:
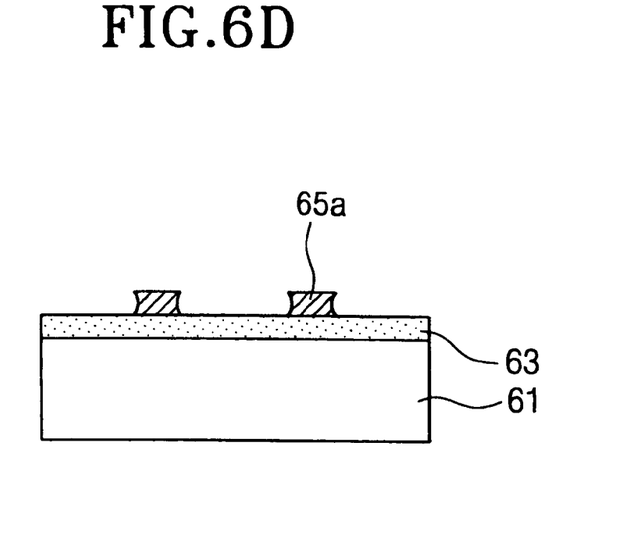

Referring to FIG. 6D, the photoresist pattern is removed to form metal runners 65a being in contact with each bonding pad of the semiconductor chip 61 and having a concave cross section.

Figure 6E:
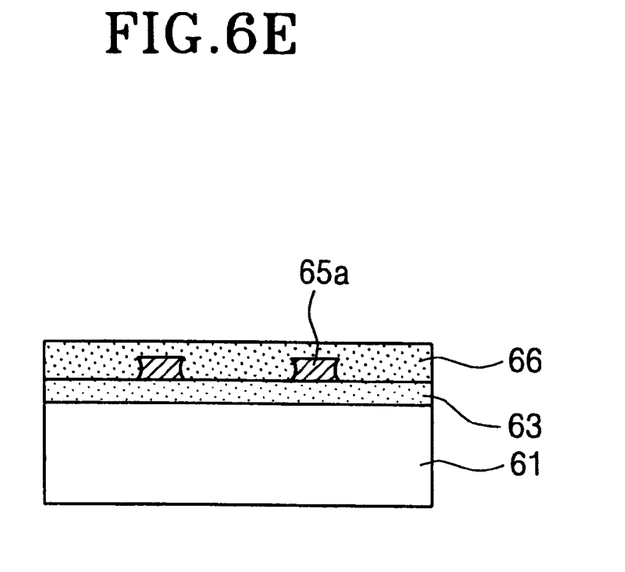

Referring to FIG. 6E, a solder mask 66, representatively made of BCB, is formed to expose a ball land of the metal runner 65a on the stress buffer layer 63 including the metal runners 65a. Thereafter, although it is not shown in the drawings, a solder ball is adhered on the exposed ball land, thereby completing a package.

According to this third embodiment, the metal runner 65a has a concave cross section, thereby reducing stress concentration on each corner of the metal runner 65a and preventing split generation of the solder mask 66.

As described above, according to the present invention, the metal runner has a concave cross section, thereby reducing stress concentration on each corner of the metal runner, compared with metal runners having a rectangular cross section or a trapezoidal cross section.

Therefore, it is possible to prevent split generation of the solder mask and improve reliability of the chip size package with no increase in thickness of the solder mask.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a package having a metal runner comprising steps of:
    forming a stress buffer layer on a semiconductor chip having a plurality of bonding pads to expose a bonding pad;
    applying negative type photoresist on the stress buffer layer;
    forming a photoresist pattern having a convex cross section and defining a metal runner formative region by exposing and developing the photoresist;
    forming a metal layer having a height approximately equal to that of the photoresist pattern on the metal runner formative region;
    removing the photoresist pattern to form a metal runner being in contact with the bonding pads of the semiconductor chip and having a concave cross section;
    forming a solder mask to expose ball land of the metal runner on the stress buffer layer including the metal runner; and
    adhering a solder ball on the exposed ball land.

2. The method for fabricating a package having a metal runner according to claim 1, wherein the convex cross section of the photoresist pattern is obtained by controlling at least one process variable selected from the group comprising temperature and time of preliminary bake, exposure sensitivity, content of solvent and developing time.

3. The method for fabricating a package having a metal runner according to claim 1, wherein the metal layer is formed by using a plating process.

4. The method for fabricating a package having a metal runner according to claim 1, wherein the metal layer is a copper layer.

5. A method for fabricating a package having a metal runner comprising steps of:
    forming a stress buffer layer on a semiconductor chip having a plurality of bonding pads to expose a bonding pad;
    applying a first photoresist of negative type on the stress buffer layer;
    forming a first photoresist pattern having an inverse trapezoidal cross section by exposing and developing the first photoresist;
    forming a first metal layer in spaces formed by the first photoresist pattern;

applying a second photoresist of negative type on the first photoresist pattern and on the first metal layer;

forming a second photoresist pattern exposing the first metal layer and having a trapezoidal cross section by exposing and developing the second photoresist;

forming a second metal layer on the exposed first metal layer;

removing the second and the first photoresist patterns to form a metal runner being in contact with the bonding pads fo the semiconductor chip and having a concave cross section;

forming a solder mask to expose a ball land of the metal runner on the stress buffer layer including the metal runner; and 6. The method for fabricating a package having a metal runner according to claim 5, wherein a combined thickness of the first and the second photoresists corresponds to the height of the metal runner.

7. The method for fabricating a package having a metal runner according to claim 5, wherein the inverse trapezoidal cross section of the first photoresist pattern and the trapezoidal cross section of the second photoresist pattern are obtained by controlling at least one process variable selected from the group comprising temperature and time of preliminary bake, exposure sensitivity, content of solvent and developing time.

8. The method for fabricating a package having a metal runner according to claim 6, wherein the first and the second metal layers are copper layers.

9. A method for fabricating a package having a metal runner comprising steps of:

forming a stress buffer layer on a semiconductor chip having a plurality of bonding pads to expose a bonding pad;

stacking negative type photoresist tapes having different etching speeds, where etching speeds of upper and lower tapes are higher than an etching speed of a central tape on the stress buffer layer;

forming a photoresist pattern having a convex cross section and defining a metal runner formative region by exposing and developing the photoresist tapes;

forming a metal layer on the metal runner formative region;

removing the photoresist pattern to form a metal runner being in contact with the bonding pads of the semiconductor chip and having a concave cross section;

forming a solder mask to expose ball land of the metal runner on the stress buffer layer including the metal runner; and adhering a solder ball on the exposed ball land.

10. The method for fabricating a package having a metal runner according to claim 9, wherein four photoresist tapes are stacked.

11. The method for fabricating a package having a metal runner according to claim 9, wherein the metal layer is a copper layer.

* * * * *